(12) United States Patent
Huang

(10) Patent No.: US 9,659,932 B2
(45) Date of Patent: May 23, 2017

(54) SEMICONDUCTOR DEVICE HAVING A PLURALITY OF FINS AND METHOD FOR FABRICATING THE SAME

(71) Applicant: TAIWAN SEMICONDUCTOR MANUFACTURING CO., LTD., Hsinchu (TW)

(72) Inventor: Yu-Lien Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/197,243

(22) Filed: Jun. 29, 2016

(65) Prior Publication Data

US 2016/0315082 A1  Oct. 27, 2016

Related U.S. Application Data

(62) Division of application No. 14/609,415, filed on Jan. 29, 2015, now Pat. No. 9,397,099.

(51) Int. Cl.
| | |
|---|---|
| *H01L 21/336* | (2006.01) |
| *H01L 27/088* | (2006.01) |
| *H01L 21/8234* | (2006.01) |
| *H01L 29/06* | (2006.01) |

(Continued)

(52) U.S. Cl.
CPC ........ *H01L 27/0886* (2013.01); *H01L 21/308* (2013.01); *H01L 21/30604* (2013.01);
(Continued)

(58) Field of Classification Search
CPC ............ H01L 27/0886; H01L 29/0642; H01L 21/823431; H01L 21/30604;
(Continued)

(56) References Cited

U.S. PATENT DOCUMENTS

| | | |
|---|---|---|
| 8,487,378 B2 | 7/2013 | Goto et al. |
| 8,697,515 B2 | 4/2014 | Yin et al. |
| (Continued) | | |

FOREIGN PATENT DOCUMENTS

| | | |
|---|---|---|
| KR | 2003-0065631 A | 8/2003 |
| KR | 10-2013-0137068 A | 12/2013 |

OTHER PUBLICATIONS

Notice of Allowance U.S. Appl. No. 14/609,415 dated Mar. 18, 2016.

(Continued)

*Primary Examiner* — Victor A Mandala

(74) *Attorney, Agent, or Firm* — McDermott Will & Emery LLP

(57) ABSTRACT

A semiconductor device having a plurality of fins including at least one first fin and at least one second fin formed on a semiconductor substrate is provided. Each of the first fin and second fin has a first portion and a second portion. A gate electrode structure overlies the first portion of the plurality of fins. The gate electrode structure includes a gate electrode, and a gate dielectric layer between the gate electrode and the plurality of fins, A first electrode overlies the second portion of the plurality of fins and the first electrode is in electrical contact with the second portion of the plurality of fins. The gate electrode structure is in direct physical contact with the first portion of the first fin and the gate electrode structure is spaced apart from the first portion of the second fin.

20 Claims, 16 Drawing Sheets

(51) Int. Cl.
  *H01L 29/78* (2006.01)
  *H01L 29/66* (2006.01)
  *H01L 21/306* (2006.01)
  *H01L 21/308* (2006.01)
  *H01L 21/3105* (2006.01)

(52) U.S. Cl.
  CPC .......... *H01L 21/31055* (2013.01); *H01L 21/823431* (2013.01); *H01L 21/823475* (2013.01); *H01L 21/823481* (2013.01); *H01L 29/0642* (2013.01); *H01L 29/0649* (2013.01); *H01L 29/6681* (2013.01); *H01L 29/66545* (2013.01); *H01L 29/785* (2013.01)

(58) Field of Classification Search
  CPC .......... H01L 29/0649; H01L 21/308; H01L 21/31055; H01L 21/823481; H01L 21/823475; H01L 29/66545
  See application file for complete search history.

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 8,946,792 B2 | 2/2015 | Cheng et al. |
| 2012/0049294 A1 | 3/2012 | Chen et al. |
| 2013/0277760 A1 | 10/2013 | Lu et al. |
| 2013/0309838 A1* | 11/2013 | Wei ............ H01L 21/76229 438/424 |
| 2013/0330889 A1 | 12/2013 | Yin et al. |
| 2014/0264589 A1 | 9/2014 | Chang et al. |
| 2014/0282326 A1 | 9/2014 | Chen et al. |
| 2015/0069528 A1 | 3/2015 | Chiang et al. |
| 2015/0084129 A1* | 3/2015 | Lee ............ H01L 29/6681 257/347 |
| 2016/0055285 A1 | 2/2016 | Baek et al. |
| 2016/0071844 A1* | 3/2016 | Shen ............ H01L 27/0886 257/392 |

OTHER PUBLICATIONS

Office Action Korean Patent Application No. 10-2015-0155828 dated Oct. 18, 2016 with full English translation.
Iotice of Allowance of Patent Korean Patent Application No. 10-2015-0155825 dated Mar. 8, 2017 with English translation.

* cited by examiner

SEMICONDUCTOR DEVICE HAVING A PLURALITY OF FINS AND METHOD FOR FABRICATING THE SAME

CROSS-REFERENCE TO RELATED APPLICATIONS

This case is a Divisional Application of U.S. Ser. No. 14/609,415 filed Jan. 29, 2015, now U.S. Pat. No. 9,397,099, the subject matter of which is incorporated herein by reference in entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls. Although existing FinFET devices and methods of fabricating FinFET devices have been generally adequate for their intended purposes, they have not been entirely satisfactory in all respects. For example, as the devices become smaller the electrical contact area between components decreases, therefore, the electrical resistance at the various contact interfaces increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
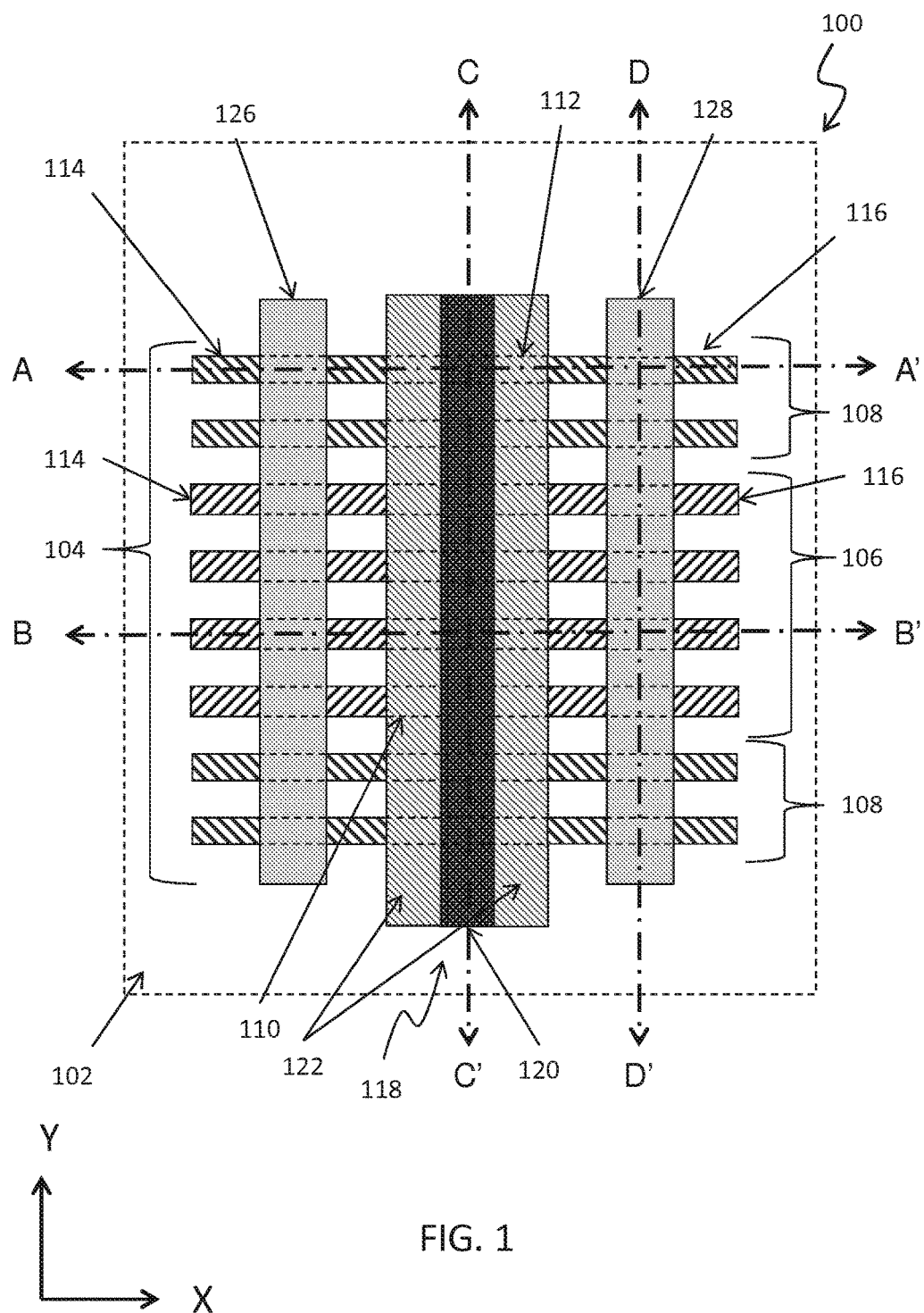
FIG. 1 is a plan view of an embodiment of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. in addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present disclosure are semiconductor devices. Such a device, for example, is a FinFET device. The FinFET device, for example, may be a complementary metal-oxide-semiconductor (CMOS) device comprising a P-type metal-oxide-semiconductor (PMOS) FinFET device and a N-type metal-oxide-semiconductor (NMOS) FinFET device. The following disclosure will continue with a FinFET example to illustrate various embodiments of the present application. It is understood, however, that the application should not be limited to a particular type of device, except as specifically claimed.

As shown in FIGS. 1-6, a semiconductor device according to various embodiments of the disclosure is described below. The semiconductor device according to this embodiment is a FinFET.

A semiconductor device 100 has an array of fins 104 formed on a semiconductor substrate 102. The array of fins 104 contains a plurality of fins including at least one first fin 106 and at least one second fin 108. The first fins 106 in this embodiment are active fins, and the second fins 108 are dummy fins. A gate electrode structure 118 overlies a first portion 110 of the first fins 106 and a first portion 112 of the second fins 108. The gate electrode structure 118 includes a gate electrode 120, and a gate dielectric layer 124 between the gate electrode 120 and the plurality of fins 106, 108. A first electrode (contact) 126 overlies the second portion 114 of the plurality of fins and the first electrode 126 is in electrical contact with the second portion 114 of the plurality of fins. The gate electrode structure 118 is in direct physical contact with the first portion 110 of the first fin 106 and the gate electrode structure 118 is spaced apart from the first portion 112 of the second fin 108.

In an embodiment of this disclosure, the semiconductor substrate 102 includes silicon, Alternatively, the semiconductor substrate 102 may include germanium, silicon germanium, gallium arsenide or other appropriate semiconductor materials. Also alternatively, the semiconductor substrate 102 may include an epitaxial layer. For example, the semiconductor substrate 102 may have an epitaxial layer overlying a bulk semiconductor. Further, the semiconductor substrate 102 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the semiconductor substrate 102 may include a semiconductor-on-insulator (SOI) structure. Also alternatively, the semiconductor substrate 102 may include a buried dielectric layer, such as a buried oxide (BOX) layer, such as that formed by separation by implantation of oxygen (SIMOX) technology, wafer bonding, SEG, or other appropriate method.

Referencing FIG. 1, an embodiment of the disclosure comprises the array of fins 104 including a plurality of first fins 106 and a plurality of second fins 108, and the fins 106, 108 are arranged substantially parallel to each other and each fin 106, 108 extends along a first direction X. The second fins 108 are arranged outside the plurality of first fins 106, and the gate electrode structure 118 extends along a second direction Y substantially perpendicular to the first direction X.

Figure 2:
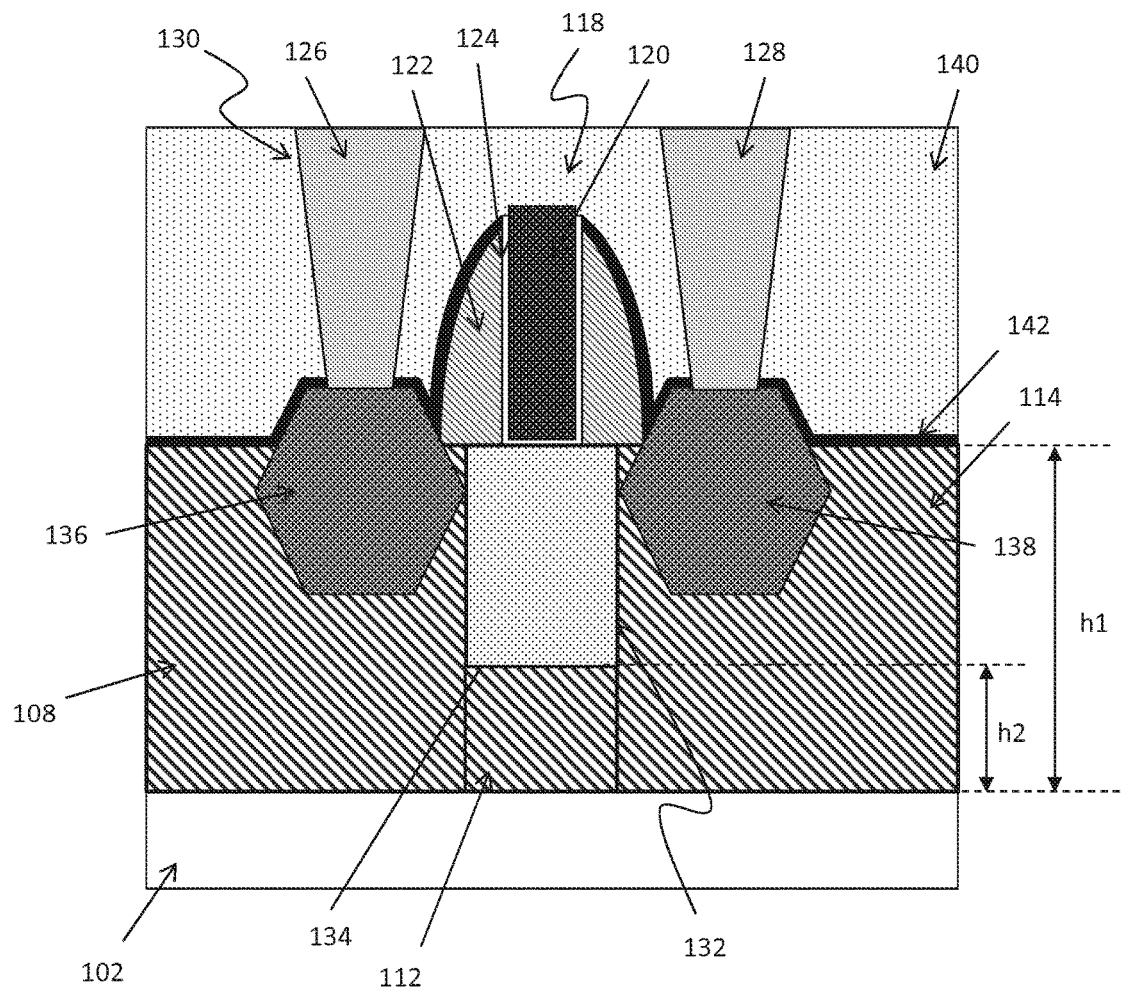
FIG. 2 is a cross section view along line A-A' of FIG. 1 in accordance with an embodiment of the disclosure.
Figure 3:
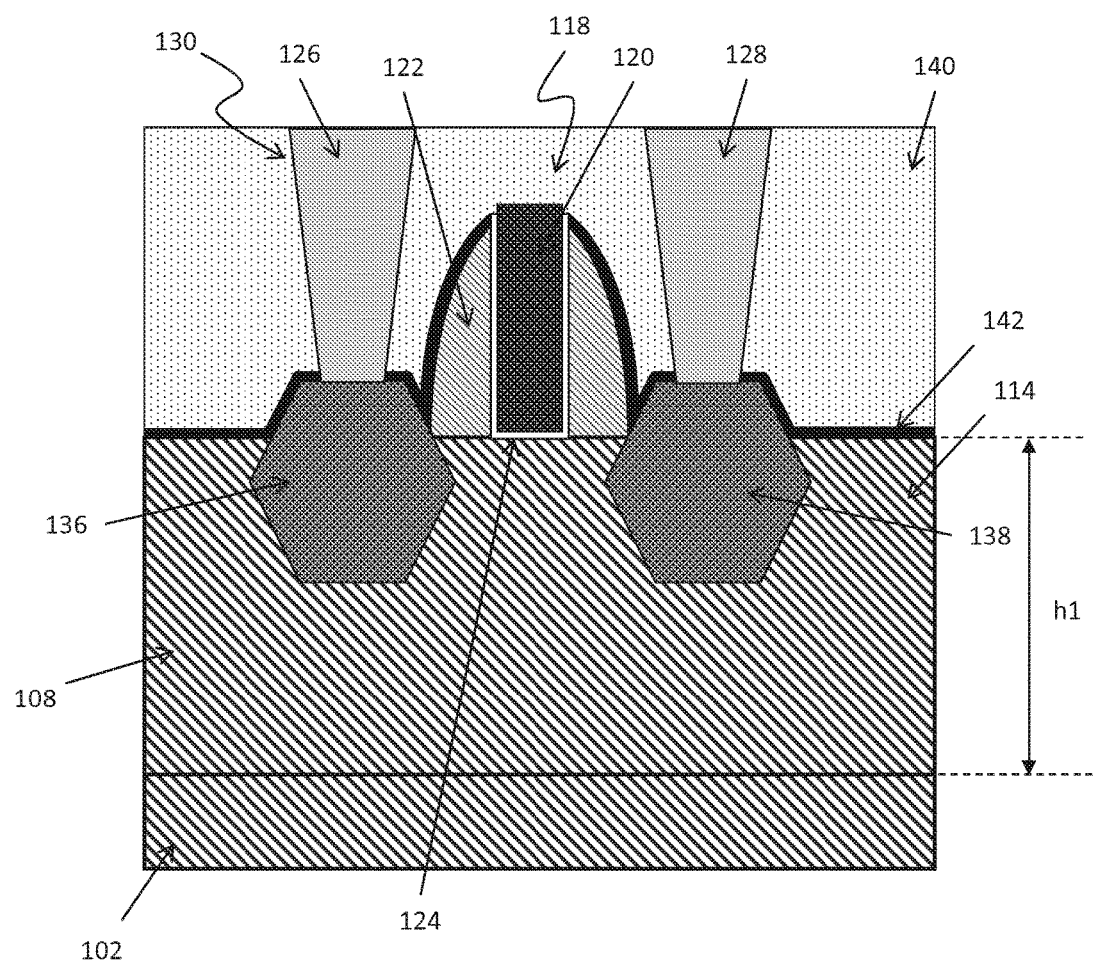
FIG. 3 is a cross section view along line B-B' of FIG. 1 in accordance with an embodiment of the disclosure.

In an embodiment of the disclosure, the first portion 110 of the first fin 106 and the second portions 114 of the first fin 106 and the second fin 108 have a first height h1, and the first portion 112 of the second fin 108 has a second height h2, wherein the second height h2 is less than the first height h1, as shown in FIGS. 2 and 3, which are cross section views A-A' and B-B', respectively.

in certain embodiments, the height h2 of the first portion 112 of the second fin 108 is about 30-110 nm lower than the height h1 of the first fin 106. In certain other embodiments the height h2 of the first portion 112 of the second fin 108 is about 40-100 nm lower than the height h1 of the first portion 110 of the first fin 106. In other embodiments, the height h2 of the first portion 112 of the second fin 108 is about 60-80 nm lower than the height hi of the first portion of the first fin 106.

The number of fins in a fin array is not specifically limited, but is a function of the overall dimensions of the FinFET device and the minimum practicable dimension of the fins.

In an embodiment of the disclosure, the gate electrode structure 118 includes gate sidewall spacers 122 extending along opposing sides of the gate electrode 120, as shown in FIGS. 1-3.

Referencing FIG. 1, in an embodiment of the disclosure, a second electrode (contact) 128 overlies a third portion 116 of the plurality of fins 106, 108. The first portion 110, 112 of the plurality of fins is between the second portion 114 and third portion 116, and the second electrode 128 is in electrical contact with the third portion 116 of the plurality of fins 106, 108. The second portion 114 and third portion 116 of the plurality of fins 106, 108 include doped regions 136, 138, such as source/drain regions, and the first and second electrodes 126, 128 are source/drain electrodes (contacts), respectively, as shown in FIGS. 2 and 3.

Figure 4:
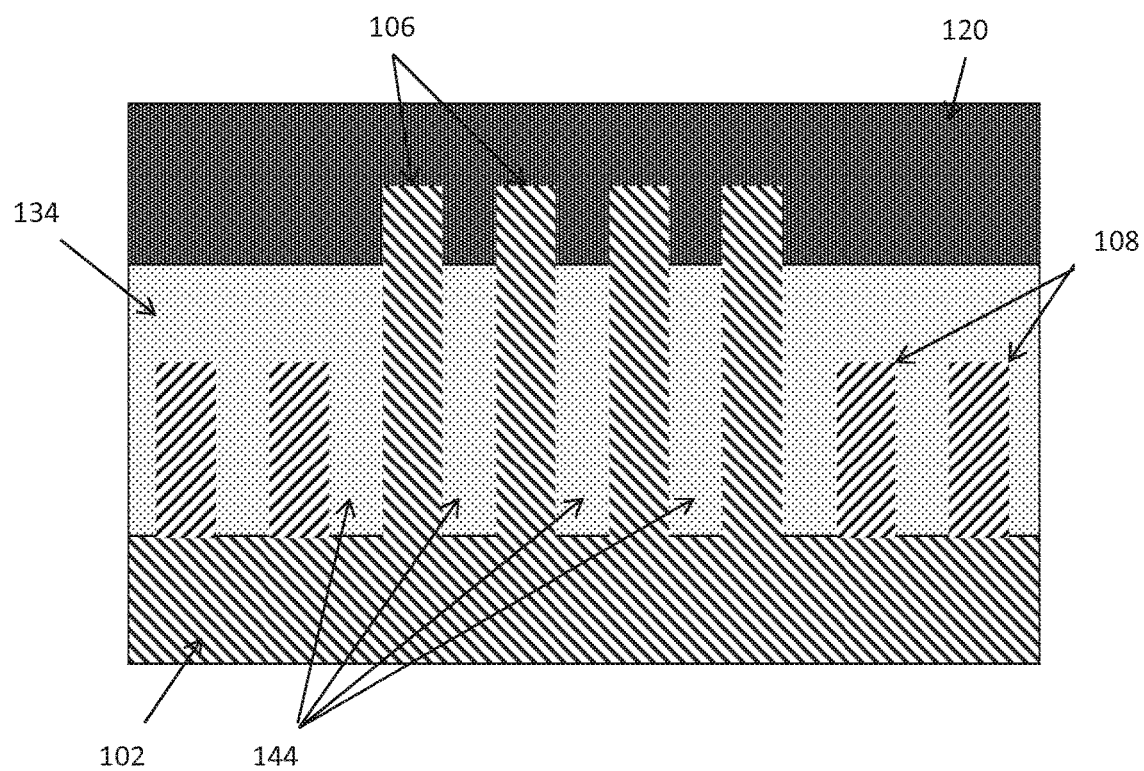
FIG. 4 is a cross section view along line C-C' of FIG. 1 in accordance with an embodiment of the disclosure.

Referencing FIGS. 2-4, an embodiment of the disclosure further includes a recess 132 formed in the first portion 112 of the second fin 108. An insulating material 134 fills the recess 132 and the regions between the plurality of fins 144. FIG. 4 depicts cross section C-C'. The recess 132 and regions between the plurality of fins 144 may be shallow trench isolation (STI) regions. A second insulating material layer 140, such as an interlayer dielectric layer, may be formed overlying the fins 106, 108, source and drain regions 136, 138, and the gate electrode structure 118. A contact etch stop layer 142 may be formed between the interlayer dielectric 140 and the fins 106, 108, source/drain regions 136, 138, and the gate electrode structure 118.

According to another embodiment of the disclosure, an array of fins 104 includes a plurality of active fins 106 and a plurality of dummy fins 108 formed on a semiconductor substrate 102. The array of fins 104 extends along a first direction Y, and each of the active fins 106 and the dummy fins 108 extend along a second direction X substantially perpendicular to the first direction Y. The dummy fins 108 are located at end regions of the array in the first direction Y. A gate electrode structure 118 overlies the array of fins 104 and extends along the first direction Y. The gate electrode structure 118 includes a gate electrode 120, gate sidewall spacers 122, and a gate dielectric layer 124. The gate dielectric layer 124 is between the gate electrode 120 and the array of fins 104. The gate electrode structure 118 is in direct physical contact with the active fins 106 and is not in direct physical contact with the dummy fins 108. Source/drain regions 136, 138 are formed in each of the fins 106, 108 in the array of fins 104, and source/drain electrodes 126, 128 are in electrical contact with the respective source/drain regions 136, 138 of each of the fins 106, 108 in the array 104.

In an embodiment of the disclosure, the dummy fins 108 include a recessed portion 132 in a region where the gate electrode structure 118 overlies the dummy fin 108. The recessed portion 132 is filled with an insulating material 134, and the regions between adjacent fins 144 are filled with the insulating material 134.

In an embodiment of the disclosure, a plurality of dummy fins 108 are located at each end region in the first direction Y of the array of fins 104, as shown in FIG. 1.

Figure 5:
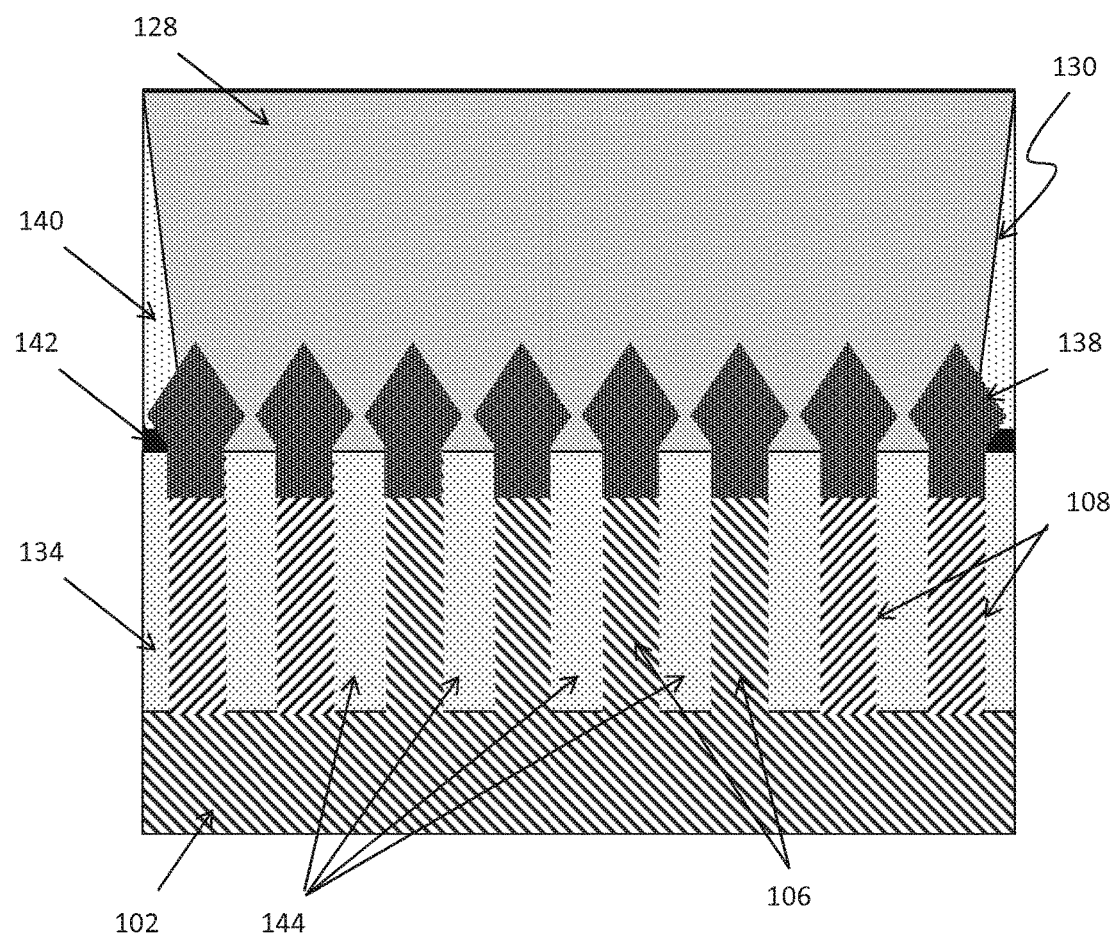
FIG. 5 is a cross section view along line D-D' of FIG. 1 in accordance with an embodiment of the disclosure.
Figure 6:
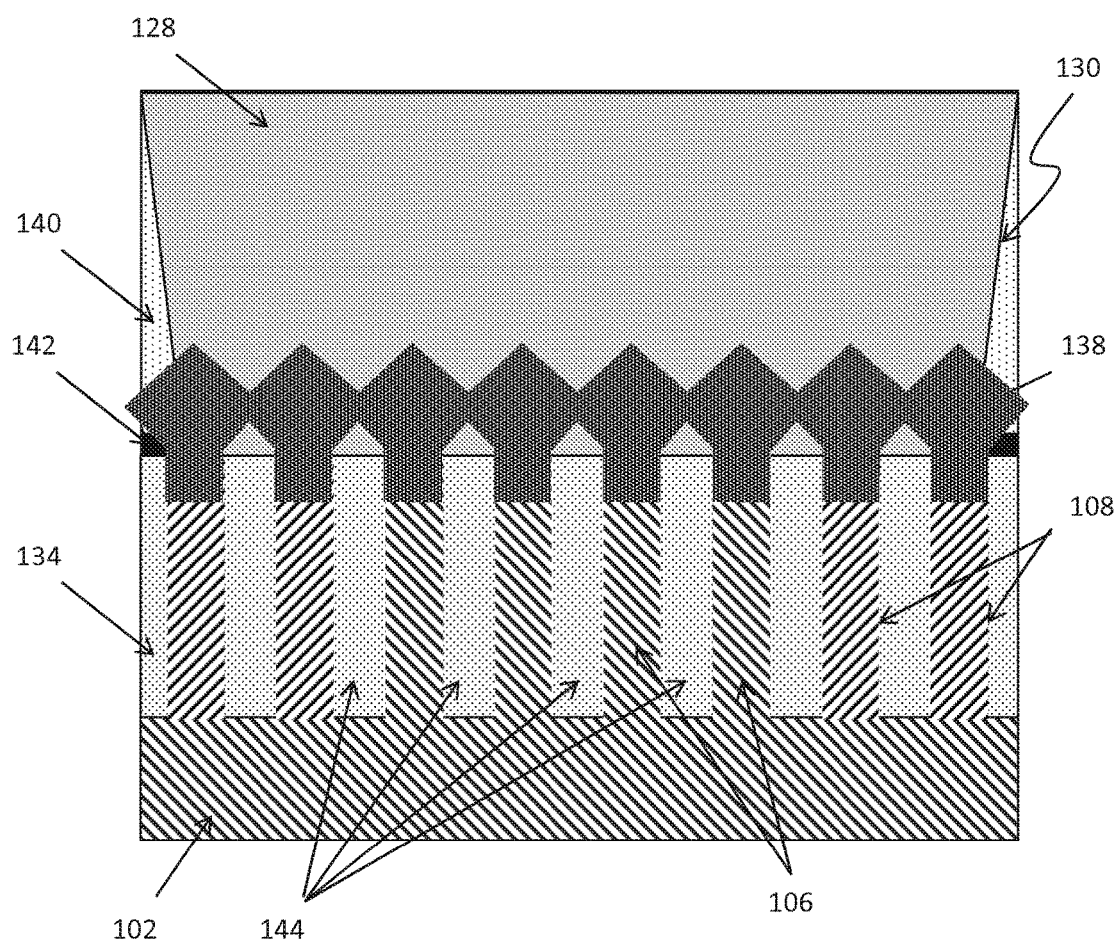
FIG. 6 is a cross section view along line D-D' of another embodiment of FIG. 1.

Cross section D-D' is illustrated in FIG. 5, which shows the drain electrode 128 contacting drain regions 138 in both the active fins 106 and the dummy fins 108. A source electrode 126 (not shown in this view) is on the other side of the gate electrode structure 118 and contacts the source regions 136 in the same way as illustrated for the drain electrode 128. In another embodiment of the disclosure, as shown in FIG. 6, depicting cross section D-D', drain regions 138 are in direct physical contact with respective neighboring drain regions 138. Source regions 136 (not shown in this view) are on the other side of the gate electrode structure 118 and the source regions 136 are in direct physical contact with neighboring source regions 136.

Figure 7:
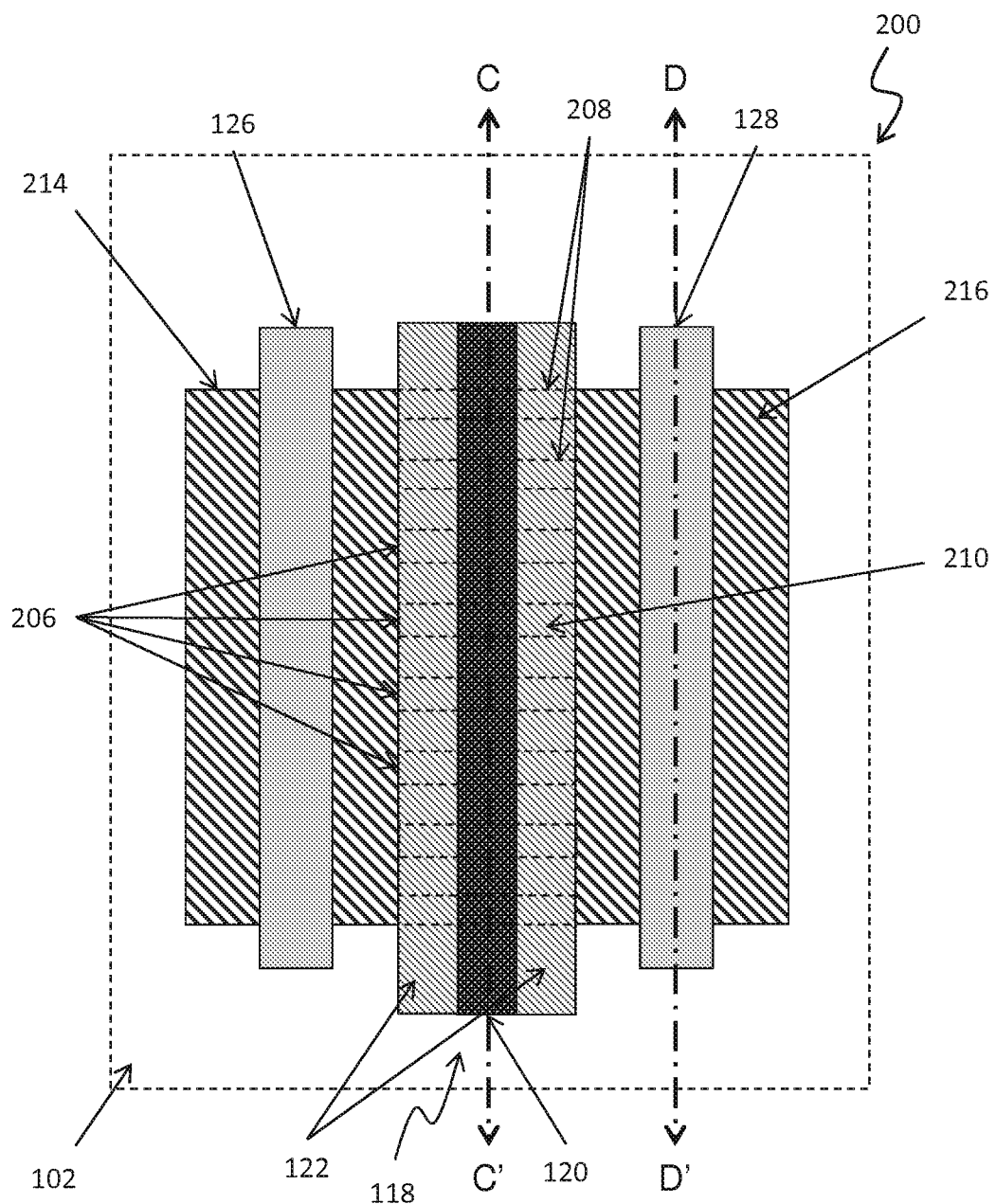
FIG. 7 is a cross section view of another embodiment of the disclosure.

In another embodiment of the present disclosure, a semiconductor device 200 with a crown arrangement of the source and drains regions is illustrated in FIG. 7. A plurality of active fins 206 and dummy fins 208 are formed on a semiconductor substrate 102. A gate electrode structure 118 comprising a gate electrode 120 and sidewall spacers 122 overlie the fins 206, 208. The active and dummy fins 206, 208 connect to common bulk substrate regions 214, 216 on opposing sides of the gate electrode structure 118. The active fins 206 are in direct physical contact with the gate electrode structure 118, while the dummy fins 208 are spaced apart from the gate electrode structure 118. A drain electrode 128 is electrically connected to the common drain region 238 arranged in the bulk substrate region 216, as shown by cross section D-D' in FIG. 9. A source electrode 126 (not shown) is electrically connected to a common source region 236 arranged in the bulk substrate region 214 on the opposing side of the gate electrode structure 118. The drain electrode 128 spans the entire length of the drain region 238. Likewise, a source electrode 126 on the opposing side of the gate electrode structure 118 spans the entire length of the source region 236.

The crown arrangement of source and drain regions is formed in certain embodiments by removing the portions of the fins 206, 208 and the STI regions 134 between the fins 206, 208 where the source and drain regions are to be formed, such as by an etching operation, and then depositing source/drain material where the fins and STI regions were removed. The source/drain regions may be formed epitaxially. Source/drain materials may include SiGe, SiC, Group III-V semiconductors, or the like. Accordingly, the ends of the plurality of fins 206, 208 are interconnected with each other through common source/drain regions.

Figure 8:
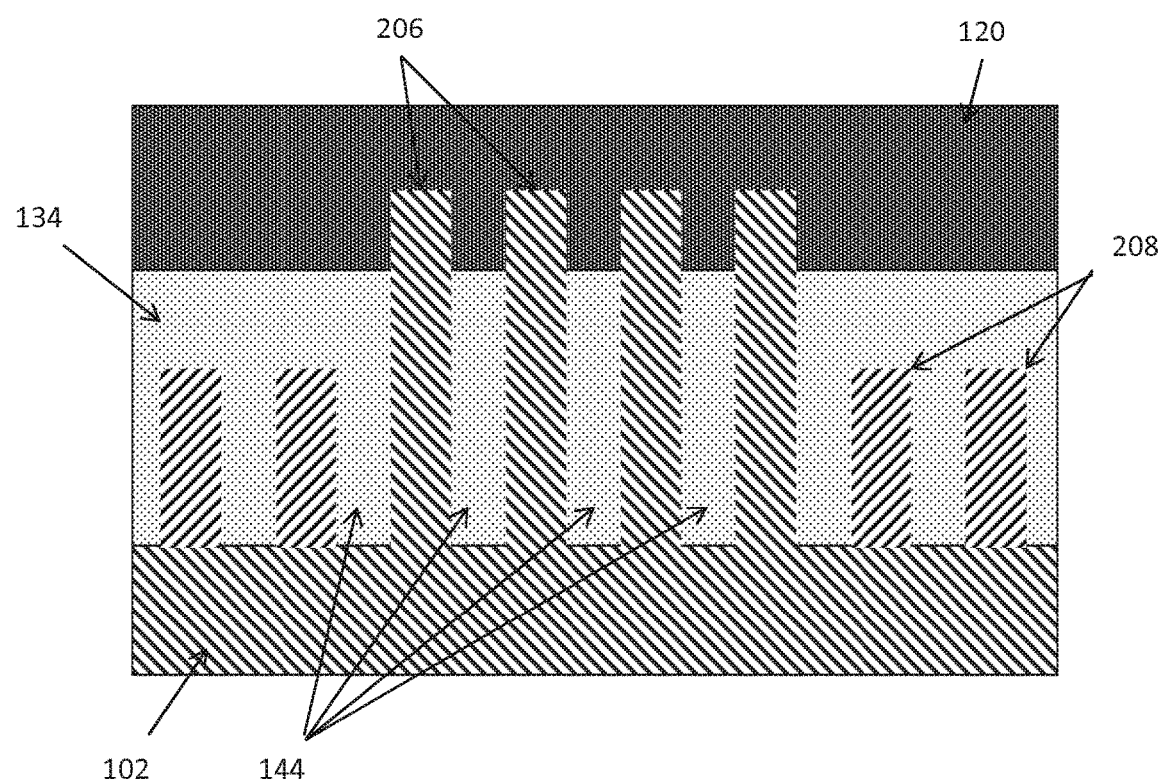
FIG. 8 is a cross section view along line C-C' of FIG. 7 in accordance with an embodiment of the disclosure.

FIG. 8 is cross section view across line C-C' showing the shorter dummy fins 208 spaced apart from the gate electrode 120 by an intervening insulation layer 134, while the active electrodes extend up to the gate electrode 120.

A method 300 for fabricating semiconductor devices according to the present disclosure will be explained herein with reference to FIGS. 1-10.

According to an embodiment of the disclosure, a method 300 for fabricating a semiconductor device includes an operation 302 of patterning a semiconductor substrate to form a plurality of fins including at least one first fin 106 and at least one second fin 108. Each of the first fin 106 and second fin 108 have a first portion 110, 112 and a second portion 114. An operation 304 of forming a mask (see FIG. 12F) over the plurality of fins prior to an operation 306 of etching the second fin is performed in some embodiments. The first portion 112 of the second fin 108 is etched to form a recess 132 in the second fin 108. In some embodiments, an operation 310 of depositing a first insulating material in regions between the plurality of fins is subsequently performed. During the operation 310 of depositing the first insulating material, the recess may also be simultaneously filled. Thus, the same material can be deposited in the recess 132 and in the region between the fins 144. In certain embodiments, the STI regions 134 are filled with the first insulating material, the device is annealed, and chemical mechanical polishing (CMP) is subsequently performed.

An operation 312 of forming a gate electrode structure overlying the first portion of the plurality of fins is subsequently performed. An operation 314 of depositing a second insulating material over the first insulating material and plurality of fins is performed after forming the gate electrode structure. An operation 316 of patterning the second insulating material to form an opening exposing the second portion of the plurality of fins is performed. The patterning operation 316 is followed by an operation 318 of depositing a conductive material in the opening formed in the pattern operation to form a first electrode (contact).

The gate electrode structure 118 includes a gate electrode 120, and a gate dielectric layer 124 between the gate electrode 120 and the plurality of fins 106, 108. The gate electrode structure 118 is in direct physical contact with the first portion 110 of the first fin 106 and the gate electrode structure 118 is spaced apart from the first portion 112 of the second fin 108. A first electrode 126 is formed in the opening 130 overlying the second portion 114 of the plurality of fins 106, 108, and the first electrode 126 is in electrical contact with the second portion 114 of the plurality of fins 106, 108.

In certain embodiments, the FINFET can be fabricated using a gate first method or a gate last method. In addition, the method for fabricating the FINFET can be either an STI first or an EPI first method. For example, in an embodiment of the disclosure, a method 400 for manufacturing a FinFET is illustrated in FIGS. 11 and 12A-12L. The method illustrated in this embodiment is an STI first/gate first method; other exemplary methods are also included within the scope of this disclosure. The method 400 comprises an operation 402 of patterning a plurality of fins on the semiconductor substrate, as shown in FIGS. 12A and 12B. A pad layer 150 is formed on the substrate 102. The pad layer 150 includes a dielectric material, such as silicon oxide, silicon nitride, silicon oxynitride, or any other suitable dielectric material. The pad layer 150 may be a single layer or multiple layers. In the present embodiment, the pad layer 150 is a dual layer that includes a silicon oxide layer 152 deposited on the semiconductor substrate 102 and a silicon nitride layer 154 deposited on the silicon oxide layer 152. The pad layer 150 can be formed by thermal oxidation, chemical oxidation, atomic layer deposition (ALD), or any other appropriate method.

A photolithography process defines fins on the semiconductor substrate 102. In the present embodiment, a patterned photoresist layer 156 is spin-on coated on the pad layer 150. The patterned photoresist layer 156 defines fins of the FinFET device 100. Generally, a patterning process may include photoresist coating (e.g., spin-on coating), soft baking, mask aligning, exposing, post-exposure baking, developing the photoresist, rinsing, drying (e.g., hard baking), other suitable processes, or combinations thereof. Alternatively, the photolithography exposing process is implemented or replaced by other proper methods such as maskless photolithography, electron-beam writing, direct-writing, and/or ion-beam writing.

Referring to FIG. 12B, the method 400 comprises a trench etching to form a plurality of fins 106, 108 in the semiconductor substrate 102. The patterned photoresist layer 156 is used as a mask during the trench etching. In the trench etching, the pad layer 150 and the semiconductor substrate 105 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility and desired etch profile.

Figure 12A:
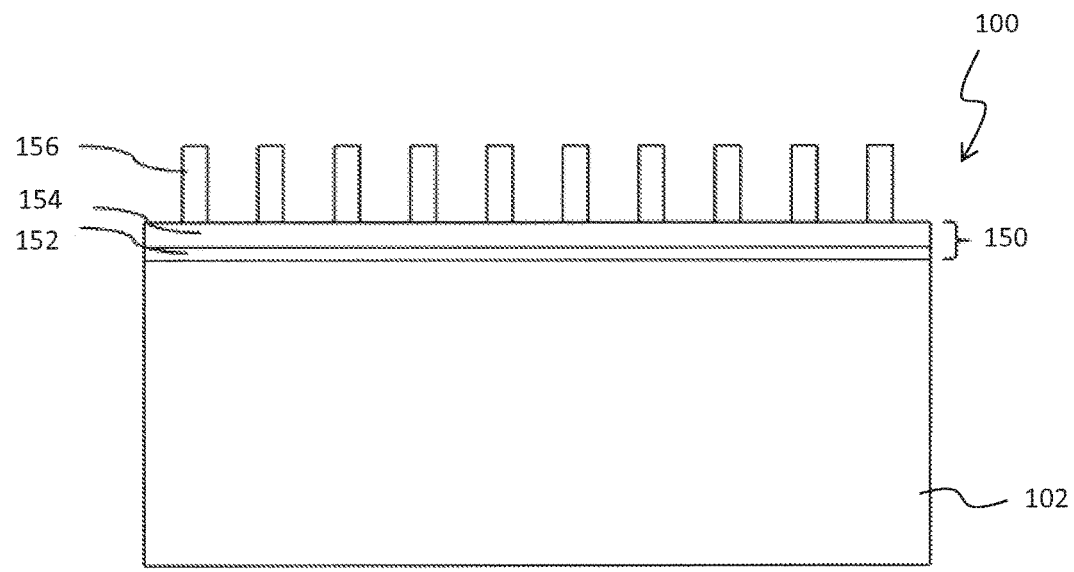
FIGS. 12A to 12L show exemplary processes for manufacturing a FinFET according to an embodiment of the disclosure.
Figure 12B:
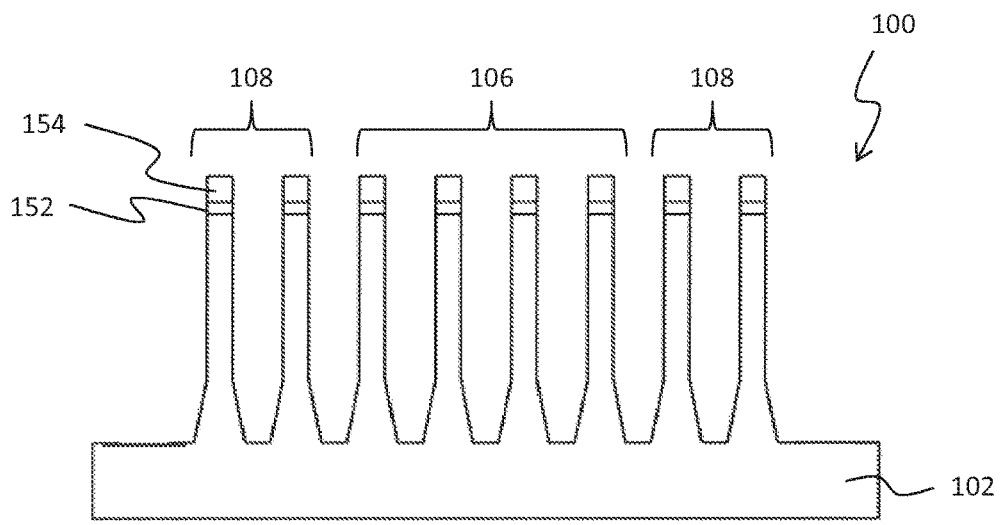
Figure 12C:
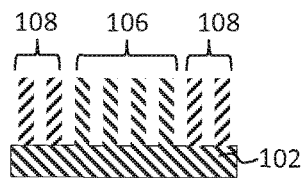
Figure 12D:
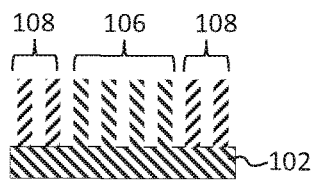
Figure 12E:
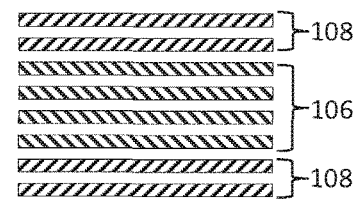

The arrangement of the thus formed fins is shown in FIGS. 12C-12E. FIG. 12C depicts the arrangement of the fins 106, 108 under the portion of the device 100 that will become the source/drain region, FIG. 12D depicts the arrangement of the fins 106, 108 under the portion of the device that will become the gate structure, and FIG. 12E is a plan view of the fins 106, 108.

Figure 12H:
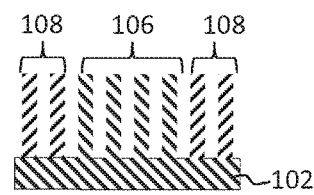
Figure 12I:
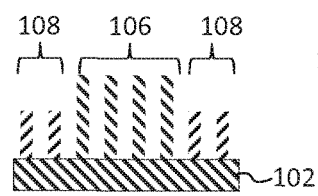
Figure 12J:
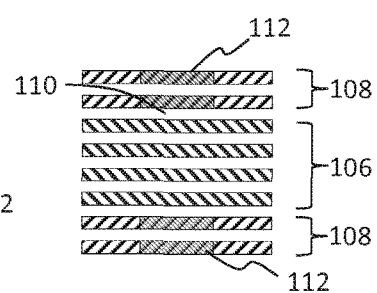
Figure 12L:
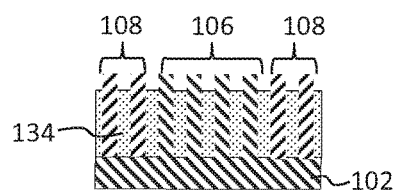
Figure 12F:
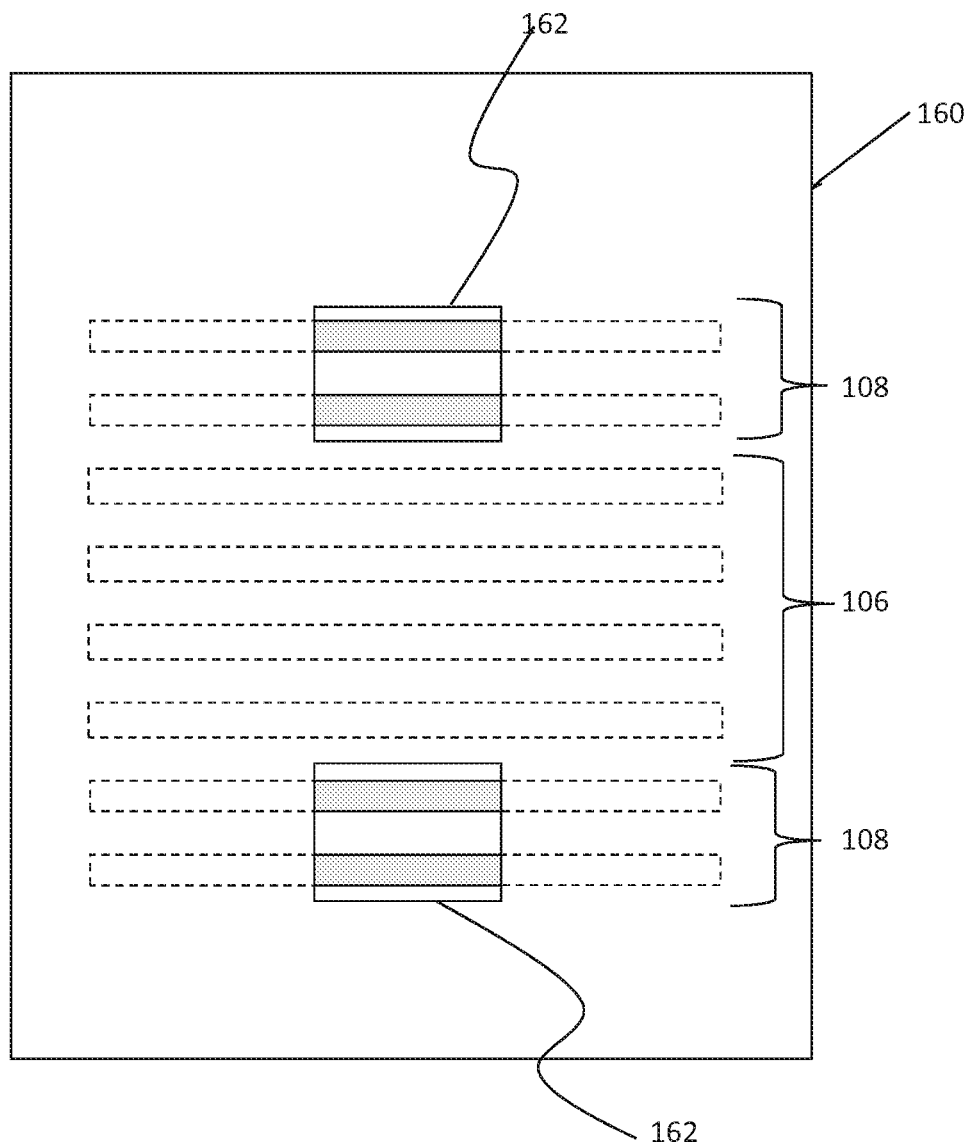
Figure 12G:
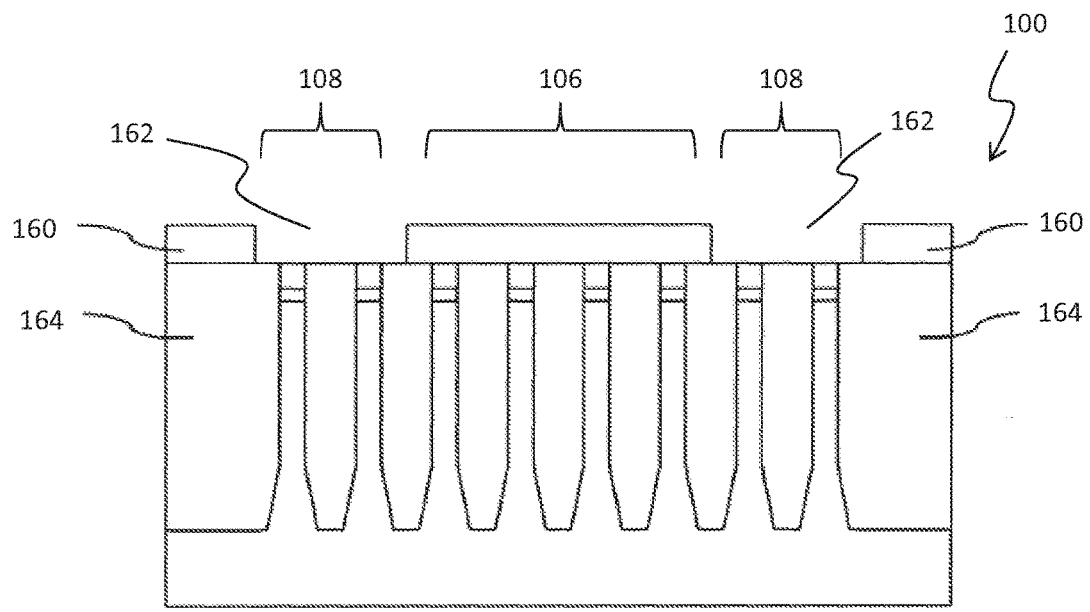

Referencing FIGS. 12F and 12G, a mask 160 is arranged over the fins 106, 108. The mask 160 includes openings 162 over portions of the dummy fins 108. Referring to FIG. 12B, the array of fins 104 includes dummy fins 108 and active fins 106.

Figure 11:
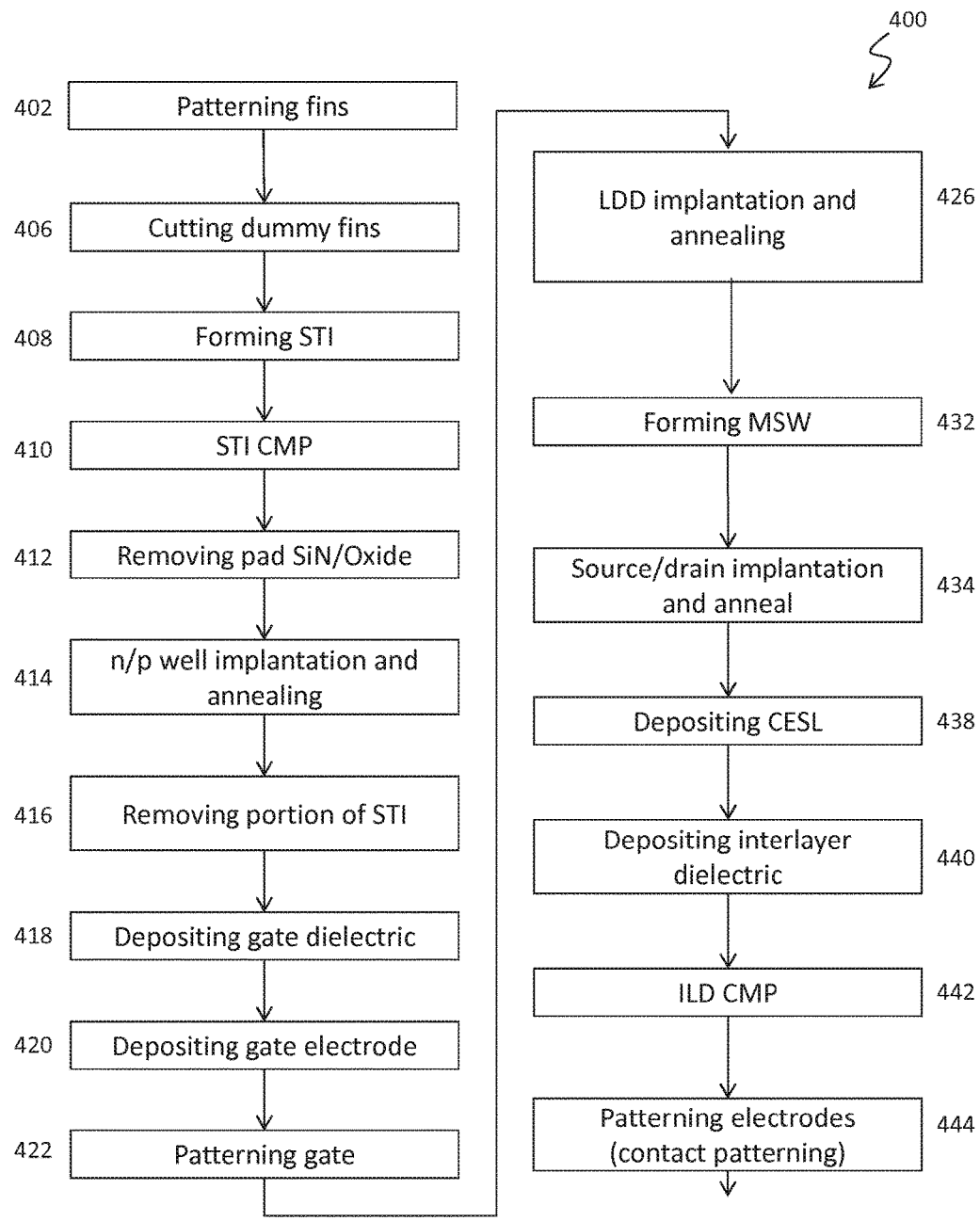
FIG. 11 is a flowchart of a method according to another embodiment of the disclosure.

Referring to FIGS. 11, 12F, and 12G, the operation 404 of cutting the dummy fins includes disposing a mask 160 over the fins. The mask 160 may be formed from a patterned photoresist layer. Openings 162 in the mask 160 define portions of the dummy fins 108 to be cut. The exposed portions of the dummy fins 108 are cut by a subsequent etching process, such as using a dry etch chemistry with fluorine-containing gases. The portions of the dummy fins 108 covered by the mask 160 and the active fins 106 remain intact during the etching process. As a result of the etching process, a recess 132 is formed in the dummy fin 108 to a depth of about 30-110 nm in certain embodiments. In certain other embodiments, the depth of the recess 132 in the dummy fin 108 is about 40-100 nm. In certain other embodiments, recess depth is between about 60 and 80 nm.

Additionally, in the depicted embodiment, before forming the mask 160 a layer of filler material 164 is formed on the semiconductor substrate 102 and fills in trenches between the fins of the array of fins 104. The layer of filler material 164 comprises any suitable material and is formed by any suitable process. For example, the layer of filler material 164 may include various organic or inorganic materials. Photoresist used for forming the mask 160 is coated on the layer of filler material layer 164 and patterned by a suitable patterning process.

After forming the recess 132, the mask 160 and the layer of filler material 164 are removed by another etching process including a wet etch, a dry etch, or a combination thereof. The resulting structure is shown in FIG. 12H, across section taken under the portion of the device 100 that will become the source/drain region, FIG. 12I, a cross section taken under the portion of the device that will become the gate structure, and FIG. 12J, a plan view of the fins 106, 108.

Figure 12K:
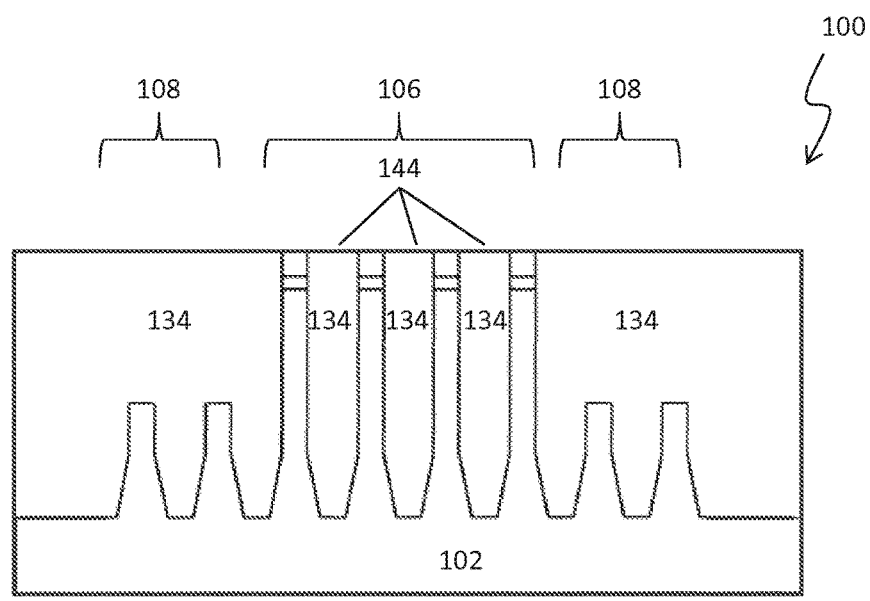

Referring to FIG. 12K, the method 400 proceeds to operation 408 of forming the shallow trench isolation (STI) regions by filling the regions between the fins 144 with a dielectric material. The forming of the STI region 134 also fills the recess 132 in the dummy fins 108 with insulating material. The STI regions 134 comprise silicon oxide, silicon nitride, silicon oxynitride, other suitable materials, and combinations thereof. The STI region 134 is formed by any suitable process. As one example, the STI regions 134 are formed by filling the region between fins 144 with one or more dielectric materials by using a chemical vapor deposition (CVD). In some embodiments, the filled region may have a multi-layer structure such as a thermal oxide liner layer filled with silicon nitride or silicon oxide. An annealing process may be performed after the formation of the STI region 134. The annealing process includes rapid thermal annealing (RTA), laser annealing processes, or other suitable annealing processes.

A chemical mechanical polishing (CMP) operation 410 is performed to remove excess material from the STI region 134 and to provide a substantially planar surface. The pad layer 150, including the silicon oxide layer 152 and silicon nitride layer are subsequently removed, such as by a suitable etching process, in operation 412. Dopant is implanted into the fins to form n and p wells in operation 414 and then the device is subsequently annealed. In operation 416, the STI region 134 is etched back to remove a portion of the STI region 134 and expose end portions of the fins 106, 108. The STI removal is performed by a suitable etching process, such as a semi-isotropic etch using HF+NH$_3$ without plasma or NF$_3$+NH$_3$ with plasma; or an isotropic etch, such as dilute HF. The resulting array of fins with exposed end portions is shown in FIG. 12L.

After forming the STI region 134, the FinFET device 100 according to embodiments of the disclosure undergoes further CMOS or MOS technology processing to form various features and regions known in the art. For example, further fabrication processes may include, among other things, forming a gate electrode structure 118, forming source and drain (SID) regions 136, 138 on each side of the gate electrode structure 118. The formation of the gate electrode structure may include depositing, patterning, and etching processes.

The gate electrode structure formation process includes the operation 418 of depositing a gate dielectric, operation of 420 depositing a gate electrode, operation 422 patterning the gate, and operation 426 of lightly doped drain (MD) implantation and annealing. An operation 432 of forming the main sidewalls (MSW) is subsequently performed on the gate electrode structure, and an operation 434 of source/drain implantation and annealing is performed.

In some embodiments, the source/drain materials may be strained source/drain materials. Examples of strained source/drain materials include SiC in a n-type metal oxide semiconductor (NMOS) and SiGe in p-type metal oxide semiconductor (PMOS).

The gate dielectric layer 124 may comprise silicon oxide, silicon nitride, silicon oxynitride, high-k dielectric material, other suitable dielectric material, and/or combinations thereof. The gate electrode 120 may comprise any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof.

In some embodiments, the gate sidewall spacers 122 are used to offset subsequently formed doped regions, such as source/drain regions. The gate sidewall spacers 122 may further be used for designing or modifying the source/drain region (junction) profile. The gate sidewall spacers 122 may be formed by suitable deposition and etch techniques, and may comprise silicon nitride, silicon carbide, silicon oxynitride, other suitable materials, or combinations thereof.

In certain embodiments the FinFET device may include raised source/drain regions 136, 138, as shown in FIGS. 3, 5, and 6. The raised source/drain regions 136, 138 are formed on portions of the dummy fins 108 and the active fins 106. The raised source/drain regions 136, 138 may be formed by one or more epitaxy or epitaxial (epi) processes, such that Si features, SiGe features, or Group III-V semiconductor material on Si EPI or other suitable features are formed in a crystalline state on the dummy fins 108 and the active fins 106. The epitaxy processes include CVD deposition techniques (e.g., vapor-phase epitaxy (VPE) and/or ultra-high vacuum CVD (UHV-CVD)), molecular beam epitaxy, and/or other suitable processes. The raised source/drain structures 136, 138 may be merged because of close proximity of the dummy fins 108 and the active fins 106, as shown in FIG. 6.

The gate electrodes in certain embodiments are formed of polysilicon and may include a polysilicon hard mask formed over the gate electrode. The polysilicon hard mask may be made a suitable hard mask material, including SiO$_2$, SiN, or SiCN. The gate electrode structure may comprise additional layers such as interfacial layers, capping layers, diffusion/barrier layers, dielectric layers, conductive layers, and other suitable layers, and combinations thereof.

After forming the source/drain regions, an operation 438 of depositing a contact etch stop layer (CESL) is performed followed by an operation 440 of depositing an interlayer dielectric (ILD) layer. The ILD layer 140 is subsequently planarized by a CMP operation 442, and source/drain electrodes 126, 128 are formed by an operation 444 of patterning the ILD layer and deposition of a conductive material, resulting in the structures shown in FIGS. 2, 3, 5, and 6. The ILD layer 140 is deposited by a suitable technique, such as CVD. The ILD layer 140 includes a dielectric material, such as silicon oxide, silicon nitride, a low-k dielectric material or a combination thereof.

In embodiments of the disclosure, the source/drain electrodes (contacts) 126, 128 are formed by patterning the ILD layer 140, such as a photolithographic process to form openings 130 exposing the source/drain regions 136, 138. A suitable conductive material, such as copper, tungsten, nickel, titanium, or the like, is deposited in the openings 130. In some embodiments a metal silicide is formed at the conductive material and source/drain interface to improve conductivity at the interface. In one example, a damascene and/or dual damascene process is used to form copper-based multilayer interconnection structures. In another embodiment, tungsten is used to form tungsten plugs in the openings 130.

Subsequent processing according to embodiments of the disclosure may also form various contacts/vias/lines and multilayer interconnect features (e.g., metal layers and interlayer dielectrics) on the semiconductor substrate 102, configured to connect the various features or structures of the FinFET device 100. For example, a multilayer interconnection includes vertical interconnects, such as conventional vias or contacts, and horizontal interconnects, such as metal lines.

Figure 9:
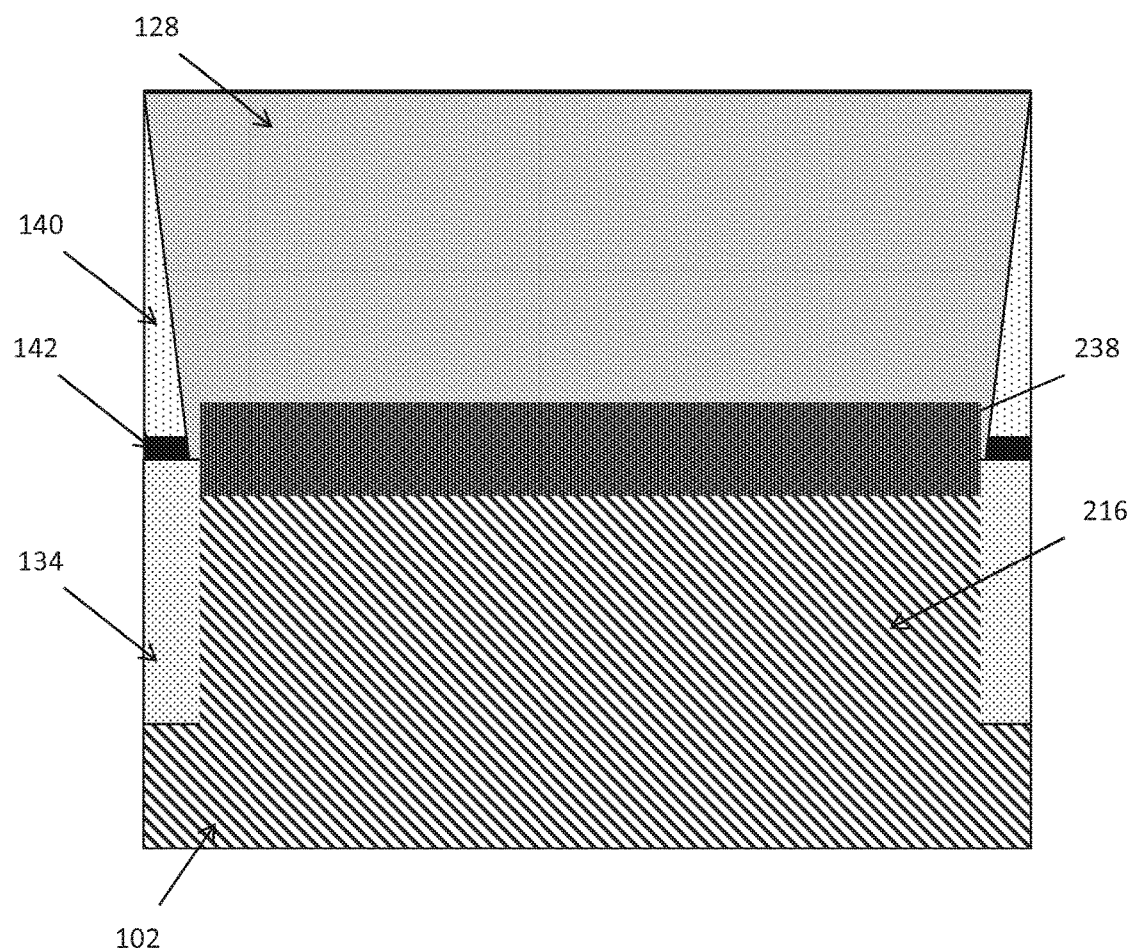
FIG. 9 is a cross section view along line D-D' of FIG. 7 in accordance with an embodiment of the disclosure.
Figure 10:
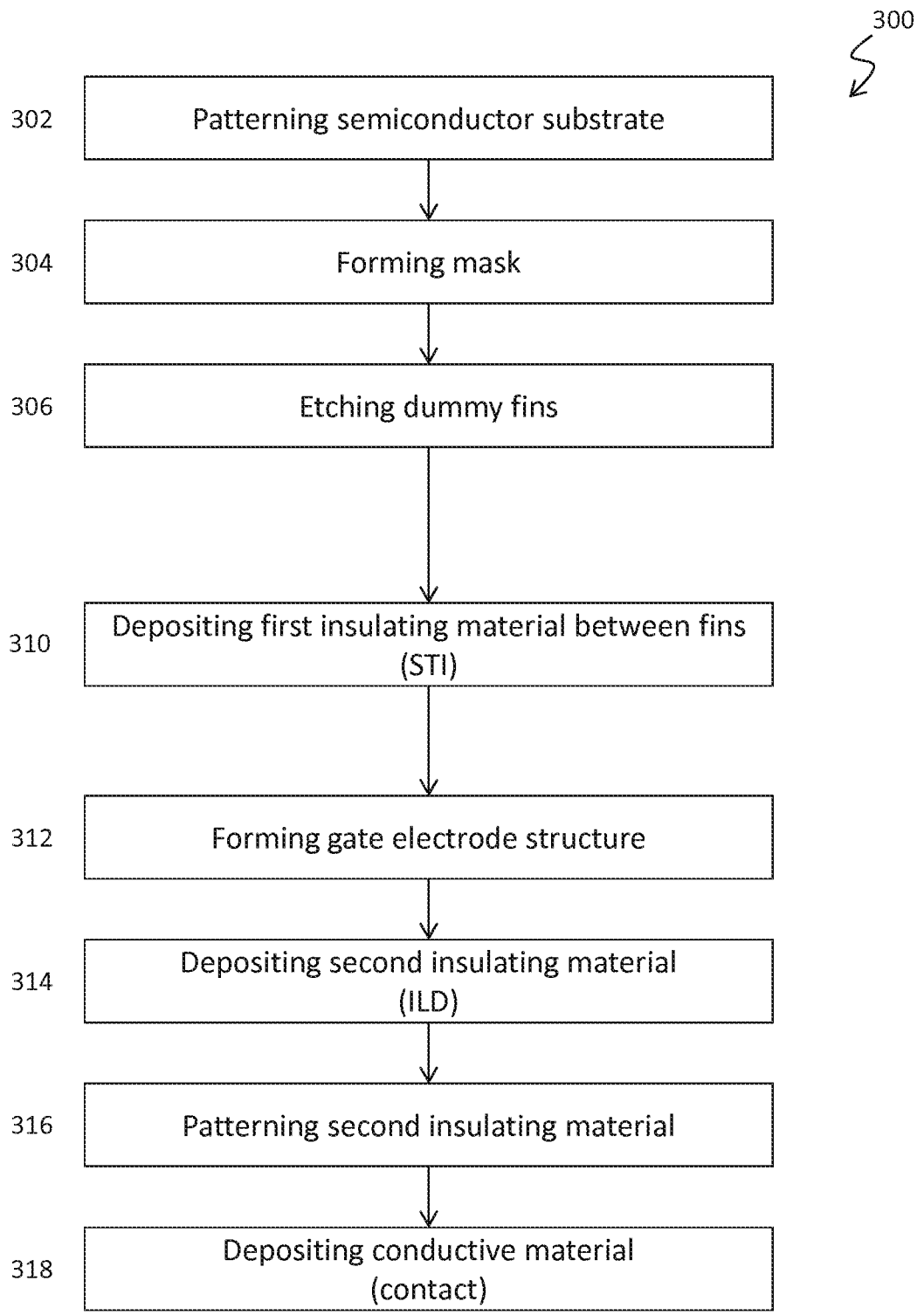
FIG. 10 is a flowchart of a method according to an embodiment of the disclosure.

As shown in FIGS. 5, 6, and 9, the source/drain electrodes 126, 128 according to embodiments of the disclosure are in electrical contact with both the active fins 106 and dummy fins 108, thereby the electrical contact area of source/drain electrodes 126, 128 is increased over embodiments where the source/drain electrodes contact the active fins and do not contact the dummy fins.

Figure 13:
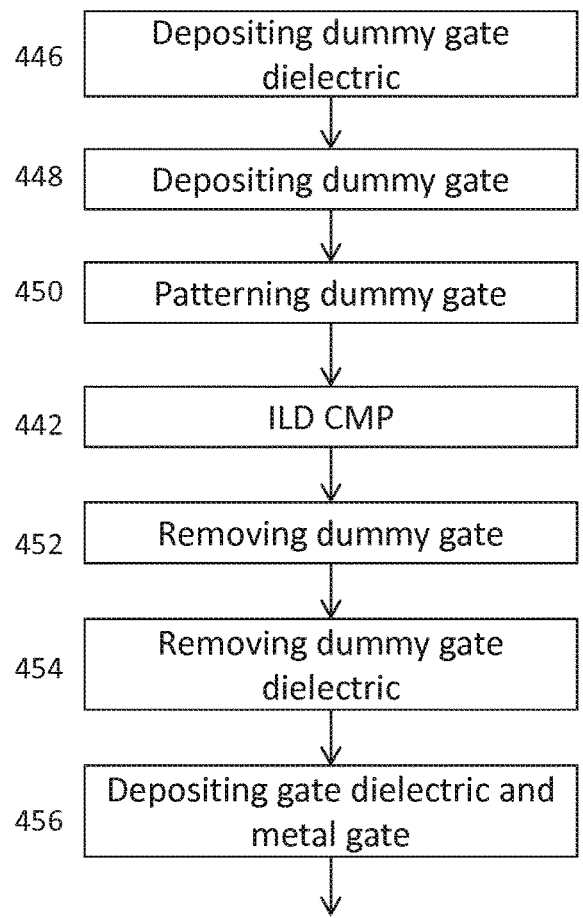
FIG. 13 is a flowchart of a method according to another embodiment of the disclosure.

In another embodiment of the disclosure, a method 500 for fabricating a FinFET is illustrated in FIG. 13. The method illustrated in this embodiment is an STI first/gate last method. Many of the operations in this embodiment are the same or similar to the operations of the STI first/gate first method 400. The methods are the same through the operation 416 of removing a portion of the STI regions.

In order to use a high-k metal gate (HK/MG), an operation 446 of depositing a dummy gate dielectric overlying the exposed end portions of the fins, an operation 448 of depositing a dummy gate, and an operation 450 of patterning the dummy gate are performed. After patterning 450 the dummy gate, the next operations are the same or similar to the STI first/gate first method 400 until after the operation 442 of CMP of the ILD. After CMP 442 of the ILD, an operation 452 of removing the dummy gate and an operation 454 of removing the dummy gate dielectric are also performed. The dummy gate and dummy gate dielectric are removed using suitable etching operations. Subsequently, an operation 456 of depositing a high k metal gate (HK/MG) occurs.

According to embodiments of the disclosure, the high k gate dielectric may comprise $HfO_2$, HfSiO, HfSiON, HMO, HMO, HfZrO, zirconium oxide, aluminum oxide, hafnium dioxide-alumina ($HfO_2$—$Al_2O_3$) alloy, other suitable high-k dielectric materials, or combinations thereof. The metal gate material may comprise one or more layers of Ti, TiN, titanium-aluminum alloy, Al, AlN, Ta, TaN, TaC, TaCN, TaSi, and the like.

After formation of the HK/MG electrode structure, the source/drain electrodes are patterned in a similar manner to the STI first/gate first method 400.

In other embodiments of the disclosure, a method for fabricating a FinFET uses an EPI first/gate first method or EPI first/gate last method. In the EPI first methods, an epitaxial layer is formed on the substrate, and then the epitaxial layer is subsequently patterned to form fins. Many of the operations in the EPI first embodiments are the same or similar to the operations of the STI first methods.

As one of skill in the art would recognize some of the steps described in the above methods can be replaced or eliminated for other embodiments of the method.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The dummy fins of the present disclosure have no functionality in the FinFET device, but rather, make FinFET processes more uniform, more reproducible, and more manufacturable. For example, the dummy fins help prevent fin bending after high temperature annealing operations. The dummy fins serve as a stress buffer during downstream shallow trench isolation (STI) formation and reduce distortion of the active fins caused by the stress. The active fins are disposed between the dummy fins. Having the dummy fins located next to the active fins, each of the active fins may be formed under a fairly similar formation surrounding in all associated locations. The formation surrounding may include the dimension of open spacing on both sides of a fin and local feature density. A consistent formation surrounding enhances uniform active fins in all associated locations, in terms of the fin's critical dimension (CD), profile, and height.

The electrical contact area of source/drain electrodes according to the present disclosure is increased over embodiments where the source/drain electrodes contact the active fins and do not contact the dummy fins. The increased contact area reduces the total resistance in the electrical circuit path formed in the FinFET. The resistance at the electrode and source/drain contact is a significant portion of the overall resistance of the total circuit resistance in a FinFET. As the semiconductor devices, such as FinFET become smaller the electrical contact area between components decreases, and therefore, the electrical resistance at the various contact interfaces increases. Because embodiments of the present disclosure have a large contact area of the source/drain electrodes, overall electrical resistance of the device decreases and device performance is improved.

According to an embodiment of the disclosure, a semiconductor device has a plurality of fins including at least one first fin and at least one second fin formed on a semiconductor substrate. Each of the first fin and second fin has a first portion and a second portion. A gate electrode structure overlies the first portion of the plurality of fins. The gate electrode structure includes a gate electrode, and a gate dielectric layer between the gate electrode and the plurality of fins. A first electrode overlies the second portion of the plurality of fins and the first electrode is in electrical contact with the second portion of the plurality of fins. The gate electrode structure is in direct physical contact with the first portion of the first fin and the gate electrode structure is spaced apart from the first portion of the second fin.

According to another embodiment of the disclosure, a fin array includes a plurality of active fins and a plurality of dummy fins formed on a semiconductor substrate. The fin array extends along a first direction, and each of the active fins and the dummy fins extend along a second direction substantially perpendicular to the first direction. The dummy fins are located at end regions of the array in the first direction. A gate electrode structure overlies the fin array and extends along the first direction. The gate electrode structure includes a gate electrode, gate sidewalls, and a gate dielectric layer. The gate dielectric layer is between the gate electrode and the fin array. The gate electrode structure is in direct physical contact with the active fins and is not in direct physical contact with the dummy fins. Source and drain regions are formed in each of the fins in the fin array, and source and drain electrodes are in electrical contact with the respective source and drain regions of each of the fins in the array.

According to another embodiment of the disclosure, a semiconductor device includes an array of fins comprising a plurality of active fins and a plurality of dummy fins formed on a semiconductor substrate, and the fin array extends along a first direction. Each of the active fins and the dummy fins extend along a second direction substantially perpendicular to the first direction. The plurality of active fins form a transistor region, and the dummy fins are located adjacent the transistor region. The plurality of fins have an active region formed therein, and the plurality of dummy fins have a region wherein at least a portion of the active region has been removed. A gate electrode structure overlies the array of fins and extends along the first direction. The gate electrode structure includes a gate electrode and a gate dielectric layer. The gate dielectric layer is between the gate electrode and the fin array. The gate electrode overlies the active regions of the active fins and overlies the dummy fins at the regions wherein at least a portion of the active region has been removed. Source and drain regions are formed in each of the fins in the array of fins, and source and drain electrodes are in electrical contact with the respective source and drain regions of each of the fins in the array.

According to yet another embodiment of the disclosure, a method for fabricating semiconductor device includes patterning a semiconductor substrate to form a plurality of fins including at least one first fin and at least one second fin, wherein each of the first fin and second fin have a first portion and a second portion. The first portion of the second fin is etched to form a recess in the second fin. A gate electrode structure is formed overlying the first portion of the plurality of fins, the gate electrode structure comprising a gate electrode, and a gate dielectric layer between the gate electrode and the plurality of fins. The gate electrode structure is in direct physical contact with the first portion of the first fin and the gate electrode structure is spaced apart from the first portion of the second fin. A first electrode is formed overlying the second portion of the plurality of fins, and the first electrode is in electrical contact with the second portion of the plurality of fins.

What is claimed is:

1. A method for fabricating a semiconductor device comprising:
    patterning a semiconductor substrate to form a plurality of fins including at least one first fin and at least one second fin, wherein each of the first fin and second fin comprise a first portion and a second portion;
    etching the first portion of the second fin to form a recess in the second fin;
    forming a gate electrode structure overlying the first portion of the plurality of fins, the gate electrode structure comprising a gate electrode, and a gate dielectric layer between the gate electrode and the plurality of fins, wherein the gate electrode structure is in direct physical contact with the first portion of the first fin and the gate electrode structure is spaced apart from the first portion of the second fin; and
    forming a first electrode overlying the second portion of the plurality of fins, wherein the first electrode is in electrical contact with the second portion of the plurality of fins.

2. The method according to claim 1, further comprising forming a mask over the plurality of fins prior to etching the second fin.

3. The method according to claim 1, further comprising depositing a first insulating material in regions between the plurality of fins.

4. The method according to claim 3, further comprising depositing a second insulating material over the first insulating material and plurality of fins after forming the gate electrode structure.

5. The method according to claim 4, further comprising:
    patterning the second insulating material to form an opening exposing the second portion of the plurality of fins; and
    depositing a conductive material in the opening to form the first electrode.

6. The method according to claim 1 further comprising forming source/drain regions on the second portion of the plurality of fins between the second portion of the plurality of fins and the first electrode.

7. The method according to claim 6, wherein source/drain regions formed on adjacent fins are in direct physical contact.

8. A method for fabricating a semiconductor device comprising:
    forming a plurality of fins, including at least one first fin and at least one second fin on a semiconductor substrate, wherein each of the first fin and second fin comprise a first portion and a second portion;
    depositing a first insulating material in regions between the plurality of fins;
    forming a mask over the plurality of fins after depositing the first insulating material;
    forming a recess in the first portion of the second fin after forming the mask;
    forming a gate electrode structure overlying the first portion of the plurality of fins, the gate electrode structure comprising a gate electrode, and a gate dielectric layer between the gate electrode and the plurality of fins, wherein the gate electrode structure is in direct physical contact with the first portion of the first fin and the gate electrode structure is spaced apart from the first portion of the second fin; and
    depositing a second insulating material over the first insulating material and plurality of fins after forming the gate electrode structure.

9. The method according to claim 8, further comprising:
    forming a first electrode overlying the second portion of the plurality of fins, wherein the first electrode is in electrical contact with the second portion of the plurality of fins.

10. The method according to claim 8, further comprising:
    patterning the second insulating material to form an opening exposing the second portion of the plurality of fins; and depositing a conductive material in the opening to form a first electrode overlying the second portion of the plurality of fins, wherein the first electrode is in electrical contact with the second portion of the plurality of fins.

11. The method according to claim 10, further comprising forming source/drain regions on the second portion of the plurality of fins between the second portion of the plurality of fins and the first electrode.

12. The method according to claim 10, wherein source/drain regions formed on adjacent fins are in direct physical contact.

13. A method for fabricating a semiconductor device comprising:

patterning a semiconductor substrate to form an array of fins comprising a plurality of active fins and a plurality of dummy fins extending along a first direction, wherein each of the active fins and the dummy fins extend along a second direction substantially perpendicular to the first direction, and a plurality of dummy fins are located at each end region of the array in the first direction, wherein each fin includes a first portion and a pair of second portions located on opposing sides of the first portion;

forming a recess in the first portion of each of the dummy fins;

forming a gate electrode structure overlying the first portion of each of the fins in the array of fins, the gate electrode structure comprising a gate electrode, and a gate dielectric layer between the gate electrode and the plurality of fins, wherein the gate electrode structure is in contact with the first portions of the active fins and the gate electrode structure is not in contact with the first portions of the dummy fins; and forming a first electrode overlying one of the second portions of each of the fins in the array of fins, wherein the first electrode is in contact with one of the second portions of each of the active fins and the dummy fins.

14. The method according to claim 13, further comprising forming a second electrode overlying another of the second portions of each of the fins in the array of fins, wherein the second electrode is located on an opposing side of the gate electrode structure from the first electrode, and the second electrode is in contact with the another of the second portions of each of the active fins and the dummy fins.

15. The method according to claim 13, further comprising forming source/drain regions at each of the second portions of each of the fins in the array of fins before forming the first electrode.

16. The method according to claim 15, further comprising removing the gate electrode structure after forming the source/drain regions, and forming a high k dielectric layer and a metal gate electrode in a region where the gate electrode structure was removed.

17. The method according to claim 13, further comprising forming a photoresist mask over the array of fins prior to forming the recess in each of the dummy fins.

18. The method according to claim 17, further comprising forming a filler material over the array of fins prior to forming the photoresist mask.

19. The method according to claim 18, further comprising removing the photoresist mask and the filler material after forming the recess in each of the dummy fins.

20. The method according to claim 13, further comprising forming an insulating material over the array fins after forming the recess in each of the dummy fins.

* * * * *